United States Patent
Kang

(10) Patent No.: US 9,151,785 B2
(45) Date of Patent: Oct. 6, 2015

(54) POWER MEASUREMENT DEVICE

(71) Applicant: Samsung Electro-Mechanics Co. Ltd., Suwon-Si (KR)

(72) Inventor: Shin Jae Kang, Anyang-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 129 days.

(21) Appl. No.: 13/626,789

(22) Filed: Sep. 25, 2012

(65) Prior Publication Data

US 2013/0082683 A1   Apr. 4, 2013

(30) Foreign Application Priority Data

Sep. 30, 2011   (KR) .................. 10-2011-0100217

(51) Int. Cl.
*G01R 19/00* (2006.01)
*G01R 21/133* (2006.01)

(52) U.S. Cl.
CPC .................... *G01R 21/1331* (2013.01)

(58) Field of Classification Search
CPC ......... G01R 11/50; G01R 11/64; G01R 11/56
USPC ........... 324/103 R, 102, 116, 139, 104
See application file for complete search history.

(56) References Cited

U.S. PATENT DOCUMENTS

| | | | | |
|---|---|---|---|---|
| 3,867,694 A | * | 2/1975 | Rauscher | 324/102 |
| 4,795,971 A | * | 1/1989 | Murao | 324/102 |
| 5,270,637 A | * | 12/1993 | McEachern et al. | 324/102 |
| 5,459,432 A | * | 10/1995 | White et al. | 329/307 |
| 5,493,209 A | * | 2/1996 | Gumm et al. | 324/76.23 |
| 7,173,980 B2 | * | 2/2007 | Masenten et al. | 375/316 |
| 7,456,781 B2 | * | 11/2008 | Honda | 342/173 |
| 2005/0017707 A1 | * | 1/2005 | Ramesh et al. | 324/102 |
| 2009/0140732 A1 | * | 6/2009 | Shrinkle et al. | 324/210 |
| 2010/0301837 A1 | * | 12/2010 | Higuma et al. | 324/140 R |
| 2010/0321085 A1 | * | 12/2010 | Jesmanowicz | 327/355 |
| 2011/0026507 A1 | * | 2/2011 | Katsube et al. | 370/338 |
| 2012/0084029 A1 | * | 4/2012 | Kang | 702/61 |
| 2012/0155667 A1 | * | 6/2012 | Nair | 381/71.6 |
| 2012/0188107 A1 | * | 7/2012 | Ashburn et al. | 341/110 |
| 2012/0223840 A1 | * | 9/2012 | Guymon et al. | 340/870.02 |
| 2012/0250370 A1 | * | 10/2012 | Taniguchi et al. | 363/34 |

FOREIGN PATENT DOCUMENTS

| | | |
|---|---|---|
| KR | 10-2006-0024710 A | 3/2006 |
| KR | 10-2011-0066006 A | 6/2011 |

* cited by examiner

*Primary Examiner* — Arleen M Vazquez
*Assistant Examiner* — Dominic Hawkins
(74) *Attorney, Agent, or Firm* — NSIP Law

(57) ABSTRACT

Provided is a power measurement device including a detection part configured to detect a supply current and a supply voltage from a commercial alternating current power supply, a frequency control part configured to transit a fundamental frequency by the supply current and the supply voltage to an intermediate frequency, a conversion part configured to generate a digital current value and a digital voltage value of the supply current and the supply voltage having the intermediate frequency applied from the frequency control part and transit the intermediate frequency to the fundamental frequency again, and a calculation/control part configured to calculate wattage using the digital current value and the digital voltage value, which are output signals of the conversion part.

14 Claims, 5 Drawing Sheets

200

300

POWER MEASUREMENT DEVICE

CROSS-REFERENCE TO RELATED APPLICATIONS

This application claims the benefit of Korean Patent Application No. 10-2011-0100217 filed with the Korea Intellectual Property Office on Sep. 30, 2011, the disclosure of which is incorporated herein by reference.

BACKGROUND OF THE INVENTION

1. Field of the Invention

The present invention relates to a power measurement device, and more particularly, to a power measurement device capable of improving measurement precision.

2. Description of the Related Art

In recent times, research on a smart grid technique through fusion of an information communication technique and a power technique is being actively performed. A goal of such a technique is to increase efficiency of a conventional power network through information communication and information technology (IT).

Interworking in the conventional power network is performed through two media such as power supply and information communication between a power provider and users. The power provider checks predicted power requirements of the users in real time through IT to prepare power supply.

In addition, a user can check the amount and charge of power consumed by oneself from the power provider in real time to determine a use pattern. A typical case of the above may be "Parameter" of Google, in which a user can search the amount and charge of currently used power through the Google internet site in real time.

As described above, in order to accomplish a smart grid, smooth information exchange through an information communication network between the power provider and power users is essential.

For this, an electronic power measurement device configured to precisely measure the amount of power consumption and convert it into digital information and a telecommunication technique for transmitting the converted digital information are needed.

Here, most of the power measurement devices are inductive watt-hour meters, and the amount of power consumption is displayed through a rotary analog instrument panel. Since the analog value cannot easily be converted into digital information, information exchange through the information communication network is impossible.

However, the latest electronic power measurement system includes a semiconductor device (integrated circuit) such as an analog-digital converter so that the amount of power consumption is converted into digital information, and the corresponding information can be exchanged through the information communication network connected via an added communication module.

SUMMARY OF THE INVENTION

The present invention has been invented in order to overcome the above-described problems and it is, therefore, an object of the present invention to provide a power measurement device, in particular, a power measurement device capable of improving measurement precision.

In accordance with one aspect of the present invention to achieve the object, there is provided a power measurement device including a detection part configured to detect a supply current and a supply voltage from a commercial alternating current power supply; a frequency control part configured to transit a fundamental frequency by the supply current and the supply voltage to an intermediate frequency; a conversion part configured to generate a digital current value and a digital voltage value of the supply current and the supply voltage having the intermediate frequency applied from the frequency control part, and transit the intermediate frequency to the fundamental frequency again; and a calculation/control part configured to calculate wattage using the digital current value and the digital voltage value, which are output signals of the conversion part.

The detection part may include a current detection part configured to detect the supply current from the commercial alternating current power supply; and a voltage detection part configured to detect the supply voltage from the commercial alternating current power supply.

The frequency control part may include a frequency generating part configured to generate a carrier frequency; and a frequency synthesizing part configured to synthesize the fundamental frequency and the carrier frequency supplied from the frequency generating part to generate the intermediate frequency.

The conversion part may include a first sigma-delta modulation part configured to convert the supply current having the intermediate frequency supplied from the frequency control part into the digital current value; a first down converter configured to recover the intermediate frequency to a band of the fundamental frequency; and a first decimation filter configured to remove a noise generated by the first sigma-delta modulation part.

The conversion part may include a second sigma-delta modulation part configured to convert the supply voltage having the intermediate frequency supplied from the frequency control part; a second down converter configured to recover the intermediate frequency to a band of the fundamental frequency; and a second decimation filter configured to remove a noise generated by the second sigma-delta modulation part.

A band of the intermediate frequency may be a band which is not affected by DC offset and a flicker noise.

In accordance with another aspect of the present invention to achieve the object, there is provided a power measurement device including a detection part configured to detect a supply current and a supply voltage from a commercial alternating current power supply; a frequency control part configured to transit a fundamental frequency by the supply current and the supply voltage to an intermediate frequency; a digital current value generating part configured to receive the supply current having the intermediate frequency to sample the supply current into a digital current value; a digital voltage value generating part configured to receive the supply voltage having the intermediate frequency to sample the supply voltage into a digital voltage value; and a calculation/control part configured to calculate a wattage using the digital current value of the digital current value generating part and the digital voltage value of the digital voltage value generating part.

The detection part may include a current detection part configured to detect the supply current from the commercial alternating current power supply; and a voltage detection part configured to detect the supply voltage from the commercial alternating current power supply.

The frequency control part may include a frequency generating part configured to generate a carrier frequency; and a frequency synthesizing part configured to synthesize the fundamental frequency and the carrier frequency supplied from the frequency generating part to generate the intermediate frequency.

The digital current value generating part may include a first sigma-delta modulation part configured to convert the supply current having the intermediate frequency supplied from the frequency control part into the digital current value; a first down converter configured to recover the intermediate frequency to a band of the fundamental frequency; and a first decimation filter configured to remove a noise generated by the first sigma-delta modulation part.

The digital current value generating part may further include a first high pass filter formed between the first sigma-delta modulation part and the first down converter to remove the noise generated by the first sigma-delta modulation part.

The digital voltage value generating part may include a second sigma-delta modulation part configured to convert the supply voltage having the intermediate frequency supplied from the frequency control part into the digital voltage value; a second down converter configured to recover the intermediate frequency to a band of the reference frequency; and a second decimation filter configured to remove a noise generated by the second sigma-delta modulation part.

The digital voltage value generating part may further include a second high pass filter formed between the second sigma-delta modulation part and the second down converter to remove the noise generated by the second sigma-delta modulation part.

A band of the intermediate frequency may be a band which is not affected by DC offset and a flicker noise.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Hereinafter, specific embodiments of the present invention will be described in detail with reference to the accompanying drawings. The following embodiments are provided as examples to fully convey the spirit of the invention to those skilled in the art.

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention. To clearly describe the present invention, parts not relating to the description are omitted from the drawings. Like numerals refer to like elements throughout the description of the drawings.

The following embodiments are provided as examples to fully convey the spirit of the invention to those skilled in the art. Therefore, the present invention should not be construed as limited to the embodiments set forth herein and may be embodied in different forms.

Hereinafter, a power measurement device in accordance with exemplary embodiments of the present invention will be described with reference to the accompanying drawings.

Figure 1:
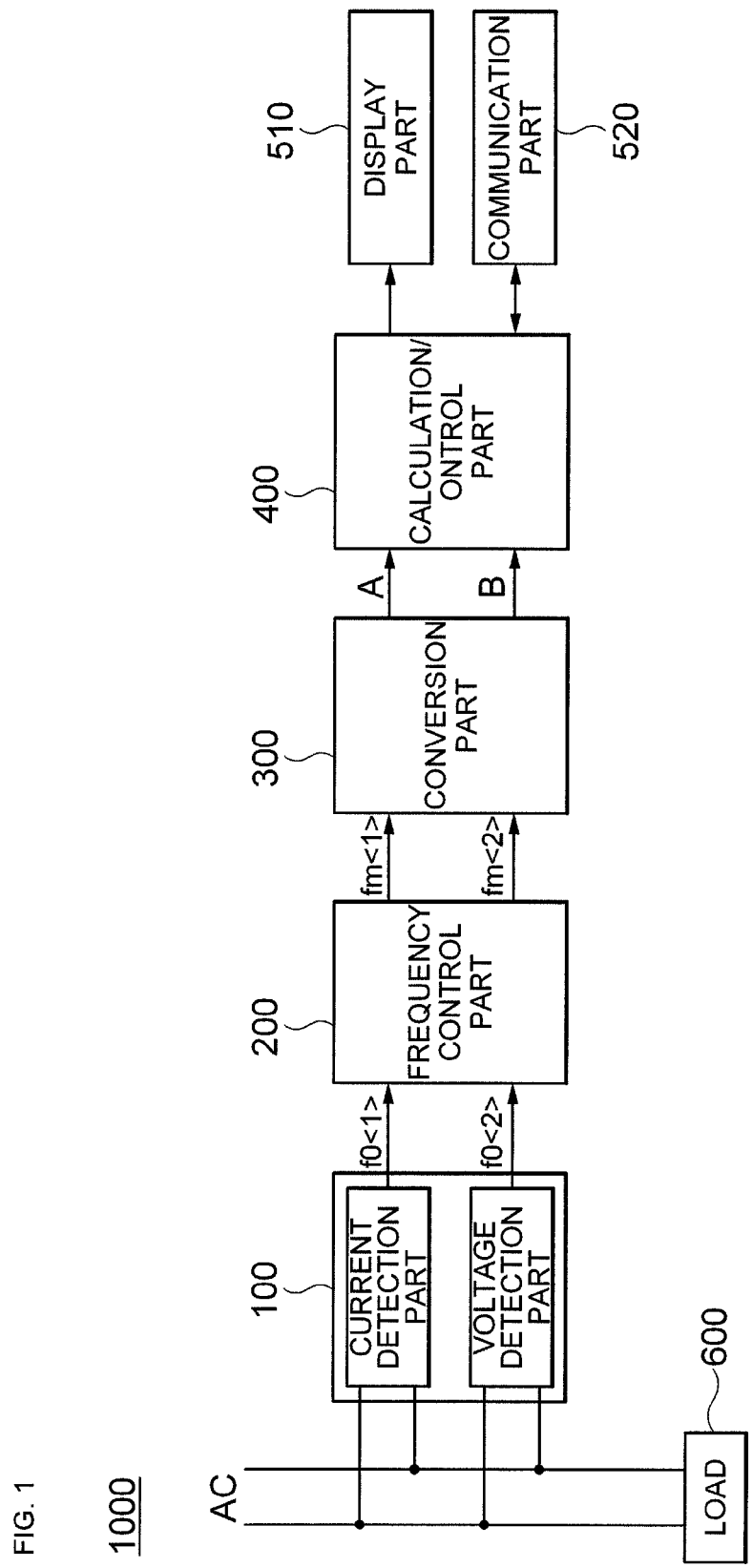
FIG. 1 is a view showing a power measurement device in accordance with an exemplary embodiment of the present invention.

FIG. 1 is a view showing a power measurement device in accordance with an exemplary embodiment of the present invention.

As shown in FIG. 1, a power measurement device 1000 in accordance with an exemplary embodiment of the present invention includes a detection part 100, a frequency control part 200, a conversion part 300, and a calculation/control part 400.

The detection part 100 includes a current detection part 100 connected to a conventional commercial alternating current power supply AC to detect a supply current supplied to a load 600, and a voltage detection part 100 connected to the alternating current power supply AC to detect a supply voltage.

Here, a detected supply current and a detected supply voltage of the detection part 100 have a first fundamental frequency fo<1> and a second fundamental frequency fo<2>. Here, the first and second fundamental frequencies fo<1> and fo<2> may be, for example, 60 Hz.

The frequency control part 200 modifies the supply current having the first fundamental frequency fo<1> and the supply voltage having the second fundamental frequency fo<2> into first and second intermediate frequencies Fm<1> and Fm<2> to provide them to the conversion part 300.

More specifically, the frequency control part 200 combines the first and second fundamental frequencies fo<1> and fo<2> supplied from the detection part 100 with a carrier frequency Fc to move them into bands of the first and second intermediate frequencies Fm<1> and Fm<2> to prevent influence due to a direct current (DC) offset and a flicker noise or 1/f noise.

Here, since the signals having the first and second intermediate frequencies Fm<1> and Fm<2> are in the regions in which there is no influence due to the DC offset and flicker noise or 1/f noise, a signal having a good signal to noise ratio (SNR) can be generated. The bands of the first and second intermediate frequencies Fm<1> and Fm<2> in the present invention may be, for example, 100 KHz.

Hereinafter, the frequency control part 200 in accordance with the present invention will be described in detail with reference to FIG. 2.

The conversion part 300 can receive the supply current having the first intermediate frequency Fm<1> and the supply voltage having the second intermediate frequency Fm<2> supplied from the frequency control part 200 to generate a digital current value A and a digital voltage value B, outputting them to the calculation/control part 400.

More specifically, the conversion part 300 can receive the supply current having the first intermediate frequency Fm<1> and the supply voltage having the second intermediate frequency Fm<2> to sample them, generating the digital current value A and the digital voltage value B.

In addition, the conversion part 300 can recover the first and second intermediate frequencies Fm<1> and Fm<2> to the first and second fundamental frequencies fo<1> and fo<2> when the digital current value A and the digital voltage value B are generated.

Hereinafter, the conversion part 300 of the present invention will be described in detail with reference to FIG. 3.

The calculation/control part 400 calculates a wattage using the digital current value A and the digital voltage value B output from the conversion part 300.

More specifically, the calculation/control part 400 receives the digital current value A and the digital voltage value B output from the conversion part 300 and multiply the two values to calculate the power, and calculates an effective power and an ineffective power using a phase difference between the two values.

A communication part 510 performs a communication function of the calculation/control part 400 with the outside, and a display part 520 displays a result of the calculation/control part 400.

Meanwhile, while the power supply is needed to operate the functional blocks shown in FIG. 1, since a DC power supply is essential to a conventional digital circuit and the necessity will be apparent to those skilled in the art, the power supply is not shown separately.

As described above, the power measurement device 1000 in accordance with an exemplary embodiment of the present invention performs sampling through a frequency transition technique using the frequency control part 200 and the conversion part 300 so that sampling of the signal having a high SNR can be performed without influence due to the DC offset and flicker noise or 1/f noise.

Accordingly, the power measurement device 1000 in accordance with an exemplary embodiment of the present invention can improve power precision and simultaneously simply design a structure of a digital filter, reducing parts cost.

Figure 2:
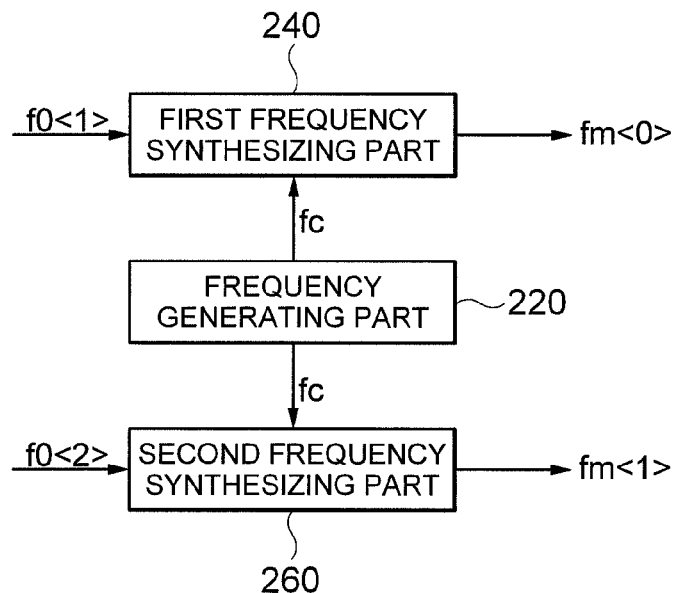
FIG. 2 is a block diagram showing a frequency control part in accordance with an exemplary embodiment of the present invention.

FIG. 2 is a block diagram showing a frequency control part in accordance with an exemplary embodiment of the present invention.

As shown in FIG. 2, the frequency control part 200 in accordance with an exemplary embodiment of the present invention includes a frequency generating part 220, a first frequency synthesizing part 240, and a second frequency synthesizing part 260.

Figure 4:
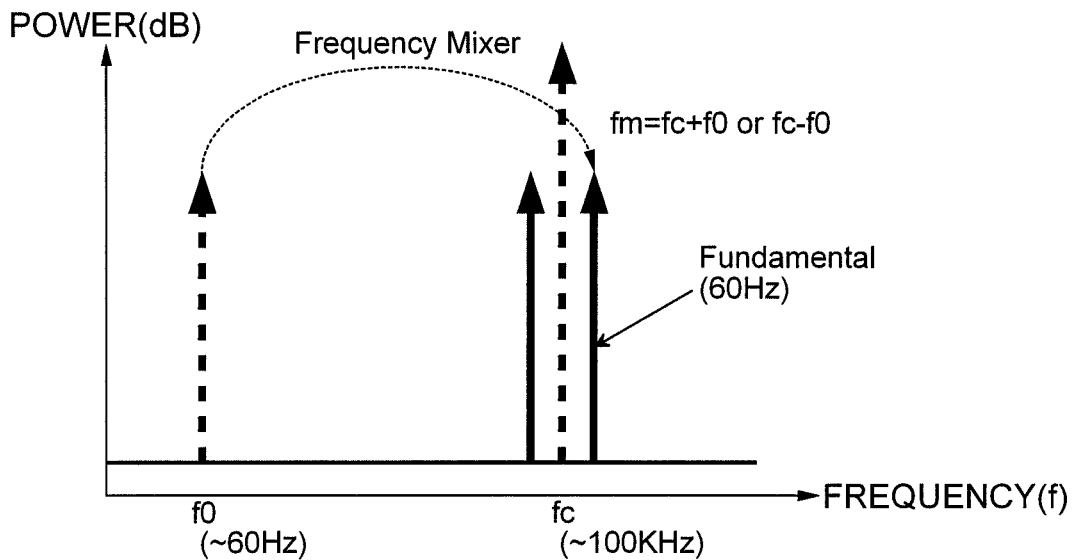
FIG. 4 is a graph showing frequency spectrum by the frequency control part.

The frequency generating part 220 can generate a carrier frequency Fc to provide it to the first and second frequency synthesizing parts 240 and 260. Conventionally, the carrier frequency Fc is a frequency for moving an arbitrary signal to a certain frequency band, and the carrier frequency Fc of the present invention is a frequency for moving the first and second fundamental frequencies fo<1> and fo<2> to a certain frequency band. Here, as shown in FIG. 4, a band of the carrier frequency Fc is a frequency band which is not affected by the DC offset and flicker noise or 1/f noise, for example, 100 KHz.

The first frequency synthesizing part 240 is connected to the current detection part 100 and the frequency generating part 220, and the first fundamental frequency fo<1> of the supply current provided by the current detection part 100 and the carrier frequency Fc generated from the frequency generating part 220 may be synthesized to generate the first intermediate frequency Fm<1>. Here, the first generated intermediate frequency Fm<1> may be provided to the conversion part 300.

The second frequency synthesizing part 260 is connected to the voltage detection part 100 and the frequency generating part 220, and the second fundamental frequency fo<2> of the supply voltage provided by the voltage detection part 100 and the carrier frequency Fc supplied from the frequency generating part 220 may be synthesized to generate the second intermediate frequency Fm<2>. Here, the second generated intermediate frequency Fm<2> may be provided to the conversion part 300.

Accordingly, the frequency control part 200 in accordance with the present invention combines the first and second fundamental frequencies fo<1> and fo<2> supplied from the detection part 100 with the carrier frequency Fc to generate the first and second intermediate frequencies Fm<1> and Fm<2>, enabling the sampling of the signal having a high SNR which is not affected by the DC offset and flicker noise or 1/f noise.

Figure 3:
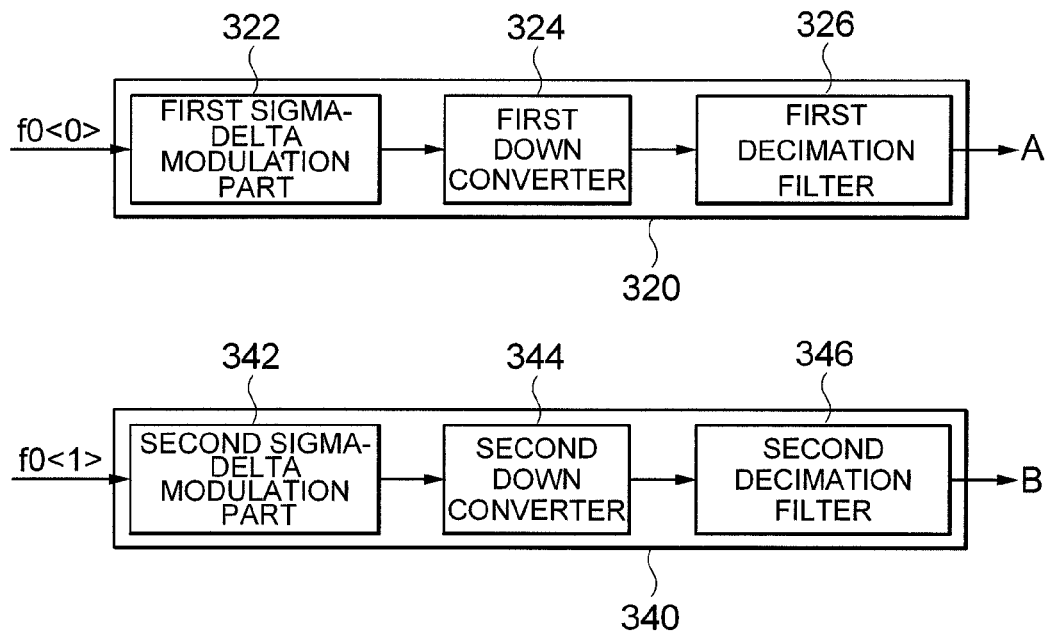
FIG. 3 is a block diagram showing a conversion part in accordance with a first exemplary embodiment of the present invention.

FIG. 3 is a block diagram showing a conversion part in accordance with a first exemplary embodiment of the present invention.

As shown in FIG. 3, the conversion part 300 in accordance with a first exemplary embodiment of the present invention includes a digital current value generating part 320 and a digital voltage value generating part 340.

The digital current value generating part 320 may include a first sigma-delta modulation part 322, a first down converter 324, and a first decimation filter 326.

The first sigma-delta modulation part 322 may modulate the first intermediate frequency Fm<1> supplied from the frequency control part 200 into the digital current value having a digital value. That is, since the supply current converted into the first intermediate frequency Fm<1> by the frequency control part 200 is an analog signal, the analog signal is converted into a digital signal by the first sigma-delta modulation part 322.

Figure 5:
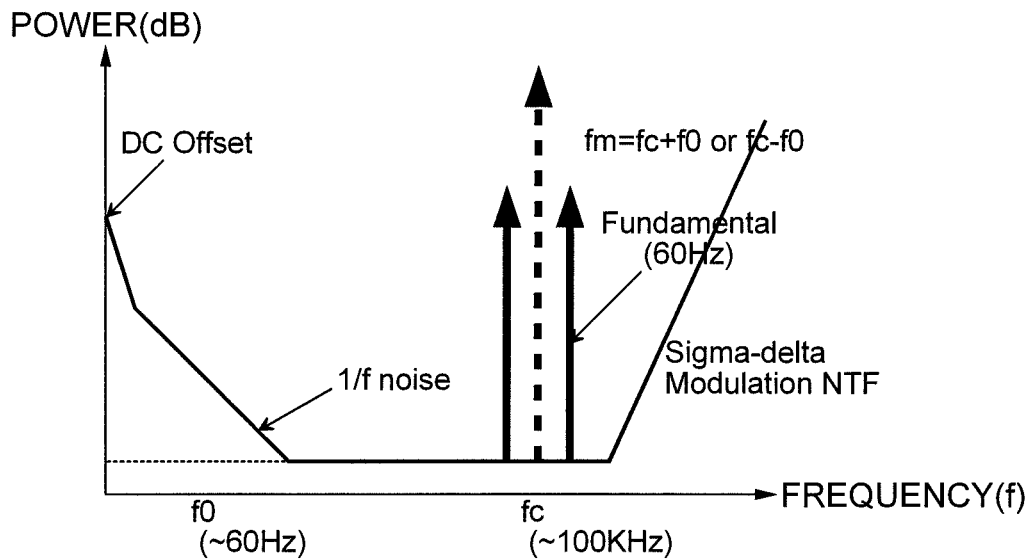
FIG. 5 is a graph showing frequency spectrum by a sigma-delta conversion part.

Here, as shown in FIG. 5, the first sigma-delta modulation part 322 may generate the frequency spectrum having the DC offset and flicker noise. However, the supply current signal in accordance with the present invention is not affected due to the DC offset and flicker noise by the first sigma-delta modulation part 322 through frequency transition.

Figure 6:
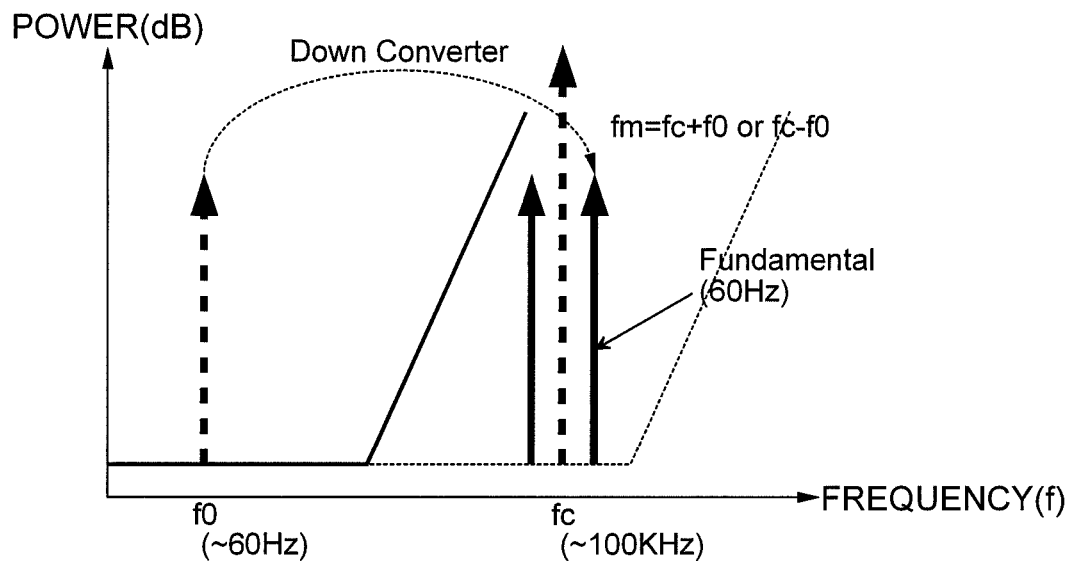
FIG. 6 is a graph showing frequency spectrum by a down converter.

A first down converter 324 can recover the first intermediate frequency Fm<1> to a band of the first fundamental frequency fo<1>. Here, as shown in FIG. 6, the DC offset and flicker noise can be reduced by the first down converter 324.

The first decimation filter 326 may include a cascaded integrator comb (CIC) filter, a sinc filter, a half-band filter, and so on.

Figure 7:
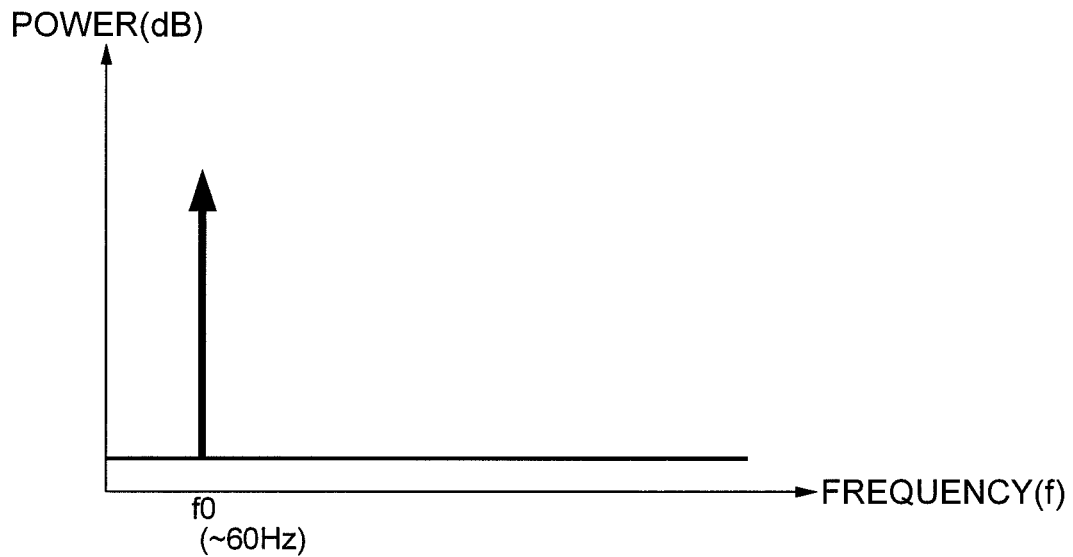
FIG. 7 is a graph showing frequency spectrum by a decimation filter.

The first decimation filter 326 can remove noises due to a noise transfer function (NTF) generated by the first sigma-delta modulation part 322. Accordingly, the frequency spectrum passed through the first decimation filter 326 may be generated as shown in FIG. 7.

The digital voltage value generating part 340 in accordance with the present invention may include a second sigma-delta modulation part 342, a second down converter 344, and a second decimation filter 346.

The second sigma-delta modulation part 342 may modulate the second intermediate frequency Fm<2> supplied from the frequency control part 200 into a digital voltage value having a digital value. That is, since the supply current converted into the second intermediate frequency Fm<2> by the frequency control part 200 is an analog signal, the analog signal is converted into a digital signal by the first sigma-delta modulation part 322.

The second down converter 344 may recover the second intermediate frequency Fm<2> to a band of the second fundamental frequency fo<2>. At this time, the DC offset and flicker noise may be reduced by the second down converter 344.

The second decimation filter 346 may include a cascaded integrator comb (CIC) filter, a sinc filter, a half-band filter, and so on.

The second decimation filter 346 can remove noises due to a noise transfer function (NTF) generated by the second sigma-delta modulation part 342.

As described above, the power measurement device 1000 in accordance with an exemplary embodiment of the present invention performs sampling through a frequency transition technique using the conversion part 300 to enable the sampling of the signal having a high SNR which is not affected by the DC offset and flicker noise or 1/f noise.

As a result, the power measurement device 1000 in accordance with an exemplary embodiment of the present invention can improve power measurement precision and simultaneously simply design a structure of a digital filter, reducing parts cost.

Figure 8:
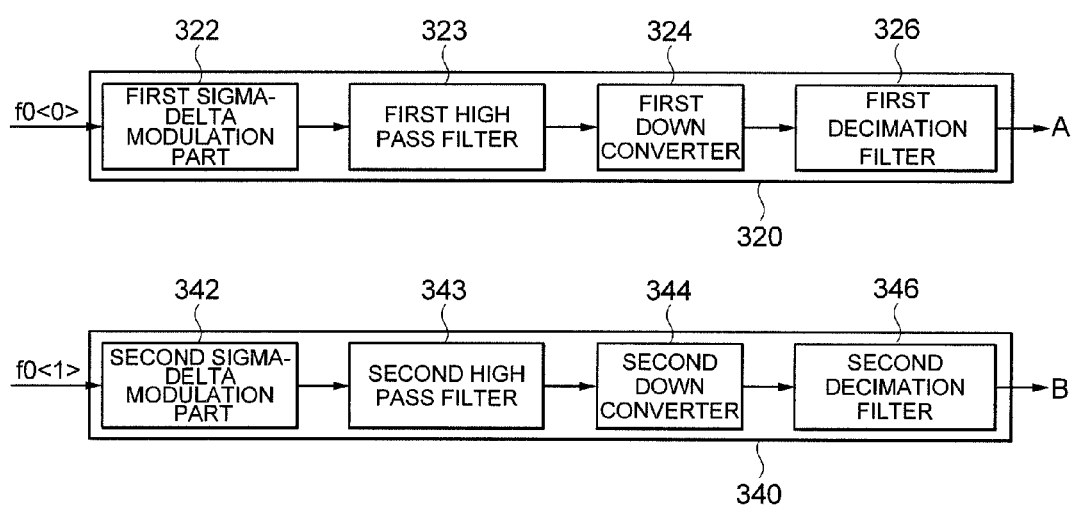
FIG. 8 is a block diagram showing a conversion part in accordance with a second exemplary embodiment of the present invention.

FIG. 8 is a block diagram showing a conversion part in accordance with a second exemplary embodiment of the present invention.

As shown in FIG. 8, the conversion part 300 in accordance with the present invention includes a digital current value generating part 320 and a digital voltage value generating part 340.

The digital current value generating part 320 may include a first sigma-delta modulation part 322, a first high pass filter 323, a first down converter 324, and a first decimation filter 326.

Here, since the first sigma-delta modulation part 322, the first down converter 324, and the first decimation filter 326 in accordance with a second exemplary embodiment of the present invention are similar to the first sigma-delta modulation part 322, the first down converter 324, and the first decimation filter 326 in accordance with a first exemplary embodiment of the present invention, only the first high pass filter 323 will be described below.

The first high pass filter 323 in accordance with the present invention may be connected to the first sigma-delta modulation part 322 and the first down converter 324 to more effectively reduce influence due to the DC offset and flicker noise.

The digital voltage value generating part 340 may include a second sigma-delta modulation part 342, a second high pass filter 343, a second down converter 344 and a second decimation filter 346.

Here, the second sigma-delta modulation part 342, the second down converter 344 and the second decimation filter 346 in accordance with a second exemplary embodiment of the present invention are similar to the second sigma-delta modulation part 342, the second down converter 344 and the second decimation filter 346 in accordance with a first exemplary embodiment of the present invention, only the second high pass filter 343 will be described below.

The second high pass filter 343 in accordance with the present invention may be connected between the second sigma-delta modulation part 342 and the second down converter 344 to more effectively reduce influence due to the DC offset and flicker noise.

As can be seen from the foregoing, the power measurement device in accordance with an exemplary embodiment of the present invention performs the sampling through the frequency transition technique using the frequency control part and the conversion part to enable the sampling of the signal having a high SNR which is not affected by the DC offset and flicker noise or 1/f noise.

Accordingly, the power measurement device in accordance with an exemplary embodiment of the present invention can improve the power measurement precision and simultaneously simply design the structure of the digital filter, reducing parts cost.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A power measurement device comprising:
a detection part configured to detect a supply current and a supply voltage from a commercial alternating current power supply;
a frequency control part configured to transit a fundamental frequency by the supply current and the supply voltage to an intermediate frequency;
a conversion part configured to generate a digital current value and a digital voltage value of the supply current and the supply voltage having the intermediate frequency applied from the frequency control part, and transit the intermediate frequency to the fundamental frequency again; and
a calculation/control part configured to calculate a wattage using the digital current value and the digital voltage value, which are output signals of the conversion part,
wherein the calculation/control part is further configured to use the wattage to calculate an effective power and an ineffective power using a phase difference between the digital current value and the digital voltage value.

2. The power measurement device according to claim 1, wherein the detection part comprises:
a current detection part configured to detect the supply current from the commercial alternating current power supply; and
a voltage detection part configured to detect the supply voltage from the commercial alternating current power supply.

3. The power measurement device according to claim 1, wherein the frequency control part comprises:
a frequency generating part configured to generate a carrier frequency; and
a frequency synthesizing part configured to synthesize the fundamental frequency and the carrier frequency supplied from the frequency generating part to generate the intermediate frequency.

4. The power measurement device according to claim 1, wherein the conversion part comprises:
a first sigma-delta modulation part configured to convert the supply current having the intermediate frequency supplied from the frequency control part into the digital current value;
a first down converter configured to recover the intermediate frequency to a band of the fundamental frequency; and
a first decimation filter configured to remove a noise generated by the first sigma-delta modulation part.

5. The power measurement device according to claim 1, wherein the conversion part comprises:
a second sigma-delta modulation part configured to convert the supply voltage having the intermediate frequency supplied from the frequency control part;

a second down converter configured to recover the intermediate frequency to a band of the fundamental frequency; and a second decimation filter configured to remove a noise generated by the second sigma-delta modulation part.

6. The power measurement device according to claim 1, wherein a band of the intermediate frequency is a band which is not affected by DC offset and a flicker noise.

7. The power measurement device comprising:
   a detection part configured to detect a supply current and a supply voltage from a commercial alternating current power supply;
   a frequency control part configured to transit a fundamental frequency by the supply current and the supply voltage to an intermediate frequency;
   a digital current value generating part configured to receive the supply current having the intermediate frequency to sample the supply current into a digital current value;
   a digital voltage value generating part configured to receive the supply voltage having the intermediate frequency to sample the supply voltage into a digital voltage value; and
   a calculation/control part configured to calculate a wattage using the digital current value of the digital current value generating part and the digital voltage value of the digital voltage value generating part,
   wherein the calculation/control part is further configured to use the wattage to calculate an effective power and an ineffective power using a phase difference between the digital current value and the digital voltage value.

8. The power measurement device according to claim 7, wherein the detection part comprises:
   a current detection part configured to detect the supply current from the commercial alternating current power supply; and
   a voltage detection part configured to detect the supply voltage from the commercial alternating current power supply.

9. The power measurement device according to claim 7, wherein the frequency control part comprises:
   a frequency generating part configured to generate a carrier frequency; and
   a frequency synthesizing part configured to synthesize the fundamental frequency and the carrier frequency supplied from the frequency generating part to generate the intermediate frequency.

10. The power measurement device according to claim 7, wherein the digital current value generating part comprises:
    a first sigma-delta modulation part configured to convert the supply current having the intermediate frequency supplied from the frequency control part into the digital current value;
    a first down converter configured to recover the intermediate frequency to a band of the fundamental frequency; and
    a first decimation filter configured to remove a noise generated by the first sigma-delta modulation part.

11. The power measurement device according to claim 7, wherein the digital current value generating part comprises a first high pass filter formed between the first sigma-delta modulation part and the first down converter to remove the noise generated by the first sigma-delta modulation part.

12. The power measurement device according to claim 7, wherein the digital voltage value generating part comprises
    a second sigma-delta modulation part configured to convert the supply voltage having the intermediate frequency supplied from the frequency control part into the digital voltage value;
    a second down converter configured to recover the intermediate frequency to a band of the reference frequency; and
    a second decimation filter configured to remove a noise generated by the second sigma-delta modulation part.

13. The power measurement device according to claim 12, wherein the digital voltage value generating part further comprises a second high pass filter formed between the second sigma-delta modulation part and the second down converter to remove the noise generated by the second sigma-delta modulation part.

14. The power measurement device according to claim 7, wherein a band of the intermediate frequency is a band which is not affected by DC offset and a flicker noise.

* * * * *